United States Patent
Kao

(10) Patent No.: US 12,444,865 B2
(45) Date of Patent: Oct. 14, 2025

(54) ELECTRONIC COMPONENT CARRIER BOARD

(71) Applicant: GLOBAL MASTER TECH. CO., LTD., Kaohsiung (TW)

(72) Inventor: Yao-Hua Kao, Kaohsiung (TW)

(73) Assignee: GLOBAL MASTER TECH. CO., LTD., Kaohsiung (TW)

( * ) Notice: Subject to any disclaimer, the term of this patent is extended or adjusted under 35 U.S.C. 154(b) by 422 days.

(21) Appl. No.: 18/159,290

(22) Filed: Jan. 25, 2023

(65) Prior Publication Data

US 2024/0178589 A1 May 30, 2024

(30) Foreign Application Priority Data

Nov. 24, 2022 (TW) .................................. 111145074

(51) Int. Cl.
*H01R 12/58* (2011.01)
*H01R 12/85* (2011.01)
*H05K 1/18* (2006.01)

(52) U.S. Cl.
CPC ............. *H01R 12/58* (2013.01); *H01R 12/85* (2013.01); *H05K 1/181* (2013.01)

(58) Field of Classification Search
CPC .... H05K 3/429; H05K 1/115; H01R 13/2421; H01R 12/523
See application file for complete search history.

(56) References Cited

U.S. PATENT DOCUMENTS

| | | | | |
|---|---|---|---|---|
| 4,560,926 A | * | 12/1985 | Cornu | G01R 1/067 324/755.05 |
| 4,787,861 A | * | 11/1988 | Kruger | G01R 1/06722 439/482 |
| 5,010,641 A | * | 4/1991 | Sisler | H01L 23/642 29/830 |
| 9,899,750 B1 | * | 2/2018 | Doiron | H01R 4/183 |

\* cited by examiner

*Primary Examiner* — Ross N Gushi
(74) *Attorney, Agent, or Firm* — MUNCY, GEISSLER, OLDS & LOWE, P.C.

(57) ABSTRACT

An electronic component carrier board includes a plurality of carrier plates, a plurality of insulating layers and a plurality of conductive members. The carrier plates are formed with a plurality of slots. The insulating layers are disposed between the carrier plates. The conductive members are made of conductive material and each is disposed in one of the slots. Each of the conductive members includes a tubular body that is inserted in a corresponding one of the slots and that defines a conductive space, and a pin body that is inserted in the conductive space and that is electrically connected with the tubular body. For each of the conductive members, at least one of the tubular body and the pin body is detachably disposed in the corresponding one of the slots.

1 Claim, 4 Drawing Sheets

ELECTRONIC COMPONENT CARRIER BOARD

CROSS-REFERENCE TO RELATED APPLICATION

This application claims priority to Taiwanese Invention Patent Application No. 111145074, filed on Nov. 24, 2022.

FIELD

This disclosure relates to an electronic component carrier board, and more particularly to an electronic component carrier board capable of being quickly reset through an insertion manner.

BACKGROUND

A printed circuit board is an indispensable carrier board element in modern technology products, and is mainly used for supporting and conducting electronic elements. A conventional wiring process for printing circuit boards is to directly print conductive copper foils on the substrate according to the required circuit patterns. Similarly, if a circuit is designed to be formed on both sides of the printed circuit board, it is required to print the conductive copper foils on two opposite sides of a substrate. To allow the conductive copper foils located on the opposite sides to be electrically connected, a via is opened on the substrate and a conductor piece is disposed in the via to achieve the purpose of electrically connecting the conductive copper foils on the opposite sides. Finally, the conductive copper foil is connected to various electronic components to form a complete circuit as long as the electronic components are installed on the printed circuit board.

With continuous development of technology, functions of electronic products are increasingly complicated, and the circuit complexity of the printed circuit board is also continuously rising. The form of a single layer plate or a double layer plate is no longer capable of satisfying demands. Thus, a multi-layer printed circuit board is launched. The multi-layer printed circuit board is formed from a plurality of carrier plates each having copper foil traces on a surface thereof, and each being formed with holes according to actual demands. The carrier plate and a plurality of insulating prepregs are disposed in an alternating arrangement, and are closely bonded to each other through a high-temperature and high-pressure press machine. At this time, the holes in the carrier plates cooperatively form plate through holes which extend through both sides the multi-layer printed circuit board, blind via holes which extend through only one side of the multi-layer printed circuit board, and buried via holes which are completely formed in the multi-layer printed circuit board. By electroplating copper in the plate through holes, blind via holes, and buried via holes, or by soldering conductive material in the plate through holes, blind via holes, and buried via holes so as to electrically interconnect the copper foil traces of the carrier plates, the wiring can be completed. The copper foil traces of the multi-layer printed circuit board are to be connected with the electronic components or connectors.

However, the aforementioned electrical connection requires placing the conductive material within each of the plate through holes, blind via holes, and buried via holes through a plating or a soldering technique, increasing the manufacturing complexity and making it more cumbersome. More importantly, when the conductive materials are all disposed to complete the electrical connection, if mistakes are found in an electrical testing, it is laborious to remove the conductive material, and to repeat the aforementioned cumbersome process, so that flexibility in applications is low and there is still room for improvement.

SUMMARY

Therefore, an object of the disclosure is to provide an electronic component carrier board that can alleviate at least one of the drawbacks of the prior art.

According to the disclosure, the electronic component carrier board includes a plurality of carrier plates, a plurality of insulating layers, a plurality of conductive members, a plurality of conductive wires and a plurality of conductive lines. The carrier plates are spaced apart from each other along a direction. Each of the carrier plates has a plurality of through holes that extend from a top surface to a bottom surface of the carrier plate. The through holes of each of the carrier plates are respectively aligned with the through holes of an adjacent one of the carrier plates so that the carrier plates cooperatively form a plurality of slots. The insulating layers are disposed between the carrier plates. The conductive members are made of conductive material and each is disposed in one of the slots. Each of the conductive members includes a tubular body that is inserted in a corresponding one of the slots and that defines a conductive space, and a pin body that is inserted in the conductive space and that is electrically connected with the tubular body. For each of the conductive members, at least one of the tubular body and the pin body is detachably disposed in the corresponding one of the slots. Each of the conductive wires is electrically connected to an outer periphery of one of the tubular bodies of the conductive members, is disposed between two adjacent ones of the carrier plates and is embedded within one of the insulating layers. The conductive lines are respectively connected to bottom ends of the tubular bodies, and aer electrically connected to the tubular bodies.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
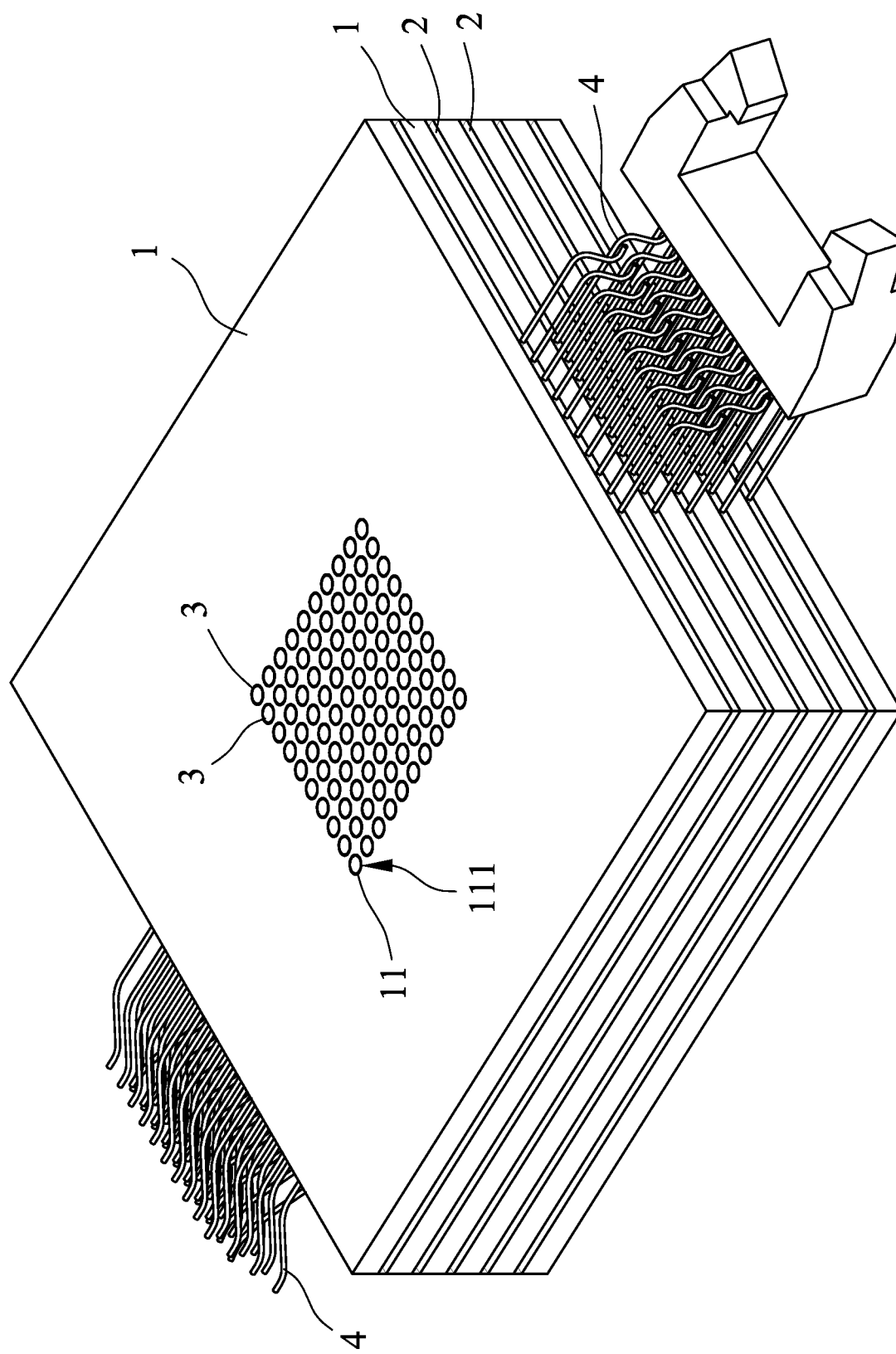
FIG. 1 is a perspective view illustrating the electronic component carrier board according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
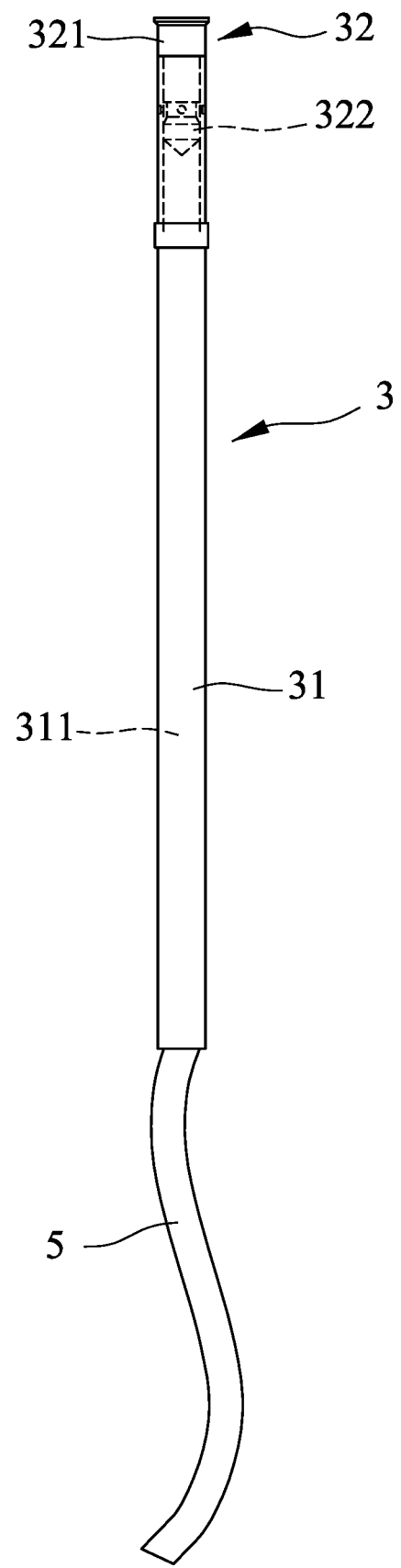
FIG. 2 is a side view of a conductive member of a first embodiment of the electronic component carrier board according to the present disclosure.

Referring to FIGS. 1 and 2, a first embodiment of an electronic component carrier board according the present disclosure includes a plurality of carrier plates 1 spaced apart from each other along a stacking direction, a plurality of insulating layers 2 disposed between the carrier plates 1 and arranged alternately with the carrier plates 1, a plurality of conductive members 3 made of a conductive material and extending through the carrier plates 1 and the insulating layers 2, a plurality of conductive wires 4 embedded in the insulating layers 2, and a plurality of conductive lines 5 respectively connected to the conductive members 3. Each of the carrier plates 1 includes a plurality of through holes 11 extending from a top surface to a bottom surface thereof. The through holes 11 of each of the carrier plates 1 are respectively aligned with and respectively communicate with the through holes 11 of the adjacent carrier plate(s) 1 so that the carrier plates 1 cooperatively form a plurality of slots 111. That is to say, each of the through holes 11 of one of the carrier plates 1 cooperates with the aligned through holes 11 of the other carrier plates 1 that are aligned therewith to form one of the slots 111.

The conductive members 3 are respectively detachably inserted in the slots 111. Each of the conductive members 3 includes a tubular body 31 detachably inserted in a corresponding one of the slots 111 and defining a conductive space 311 therein, and a pin body 32 inserted in the conductive space 311 and electrically connected to the tubular body 31. The pin body 32 has an end seat portion 321 covering a top end of the tubular body 31 and located outside the conductive space 311, and a fixing portion 322 extending from the end seat portion 321 along an axial direction of the tubular body 31 and into the conductive space 311. The fixing portion 322 is fixed to an inner wall surface of the tubular body 31.

Each of the conductive wires 4 is electrically connected to an outer peripheral surface of one of the tubular bodies 31, and is disposed between two adjacent carrier plates 1 and is embedded in one of the insulating layers 2. In this embodiment, the conductive wires 4 are electrically connected to outer peripheral surfaces of the tubular bodies 31 through physical contact. Each conductive line 5 is connected to a bottom end of the corresponding one of the tubular bodies 31, and is electrically connected to the corresponding tubular body 31.

The first embodiment completes electrical connection with the conductive wires 4 simply by directly inserting the conductive members 3 into the slots 111. The process is quick and easy. It should be noted that, according to actual demands, some of the conductive members 3 may not be into the slots 111. That is to say, not all of the conductive members 3 need to be inserted into the corresponding slots 111. The adjustments and arrangements are very flexible. In addition, if the electrical test for the first embodiment is found to be erroneous, some of the conductive members 3 that incur the issue can be directly removed from the slots 111, and then the necessary adjustment, debug, and reassembly processes can be repeated, which is not only convenient to adjust, but also effectively improves operation speed.

Figure 3:
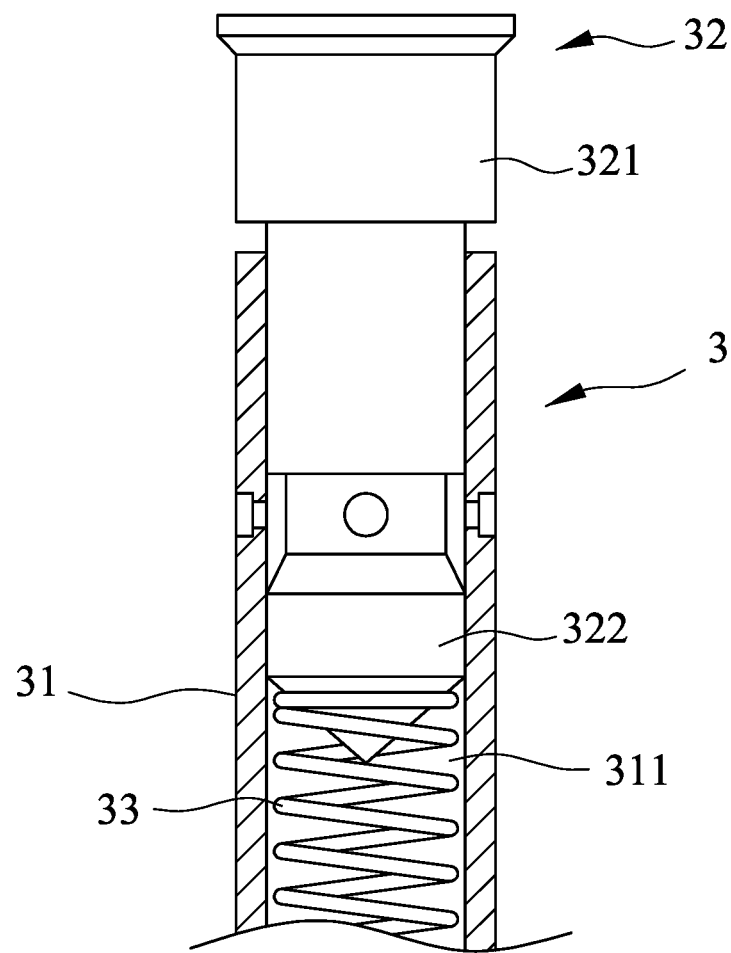
FIG. 3 is a fragmentary side sectional view of a conductive member of a second embodiment of the electronic component carrier board according to the present disclosure.

Referring to FIGS. 1 and 3, a second embodiment of the electronic component carrier board of the present disclosure is shown to be similar to the first embodiment, and differs in that: each of the conductive members 3 further includes a spring 33 sleeved on the fixing portion 322 of the pin body 32 and located within the conductive space 311. Two ends of the spring 33 respectively abut against the end seat portion 321 and the tubular body 31. The pin body 32 is disposed on the tubular body 31, and is able to be pushed along the conductive space 311 by the spring 33. The second embodiment is designed such that the top ends of the conductive members 3 are elastic, so as to be able to cooperating with detection probes of a test tool that are not elastic, increasing compatibility between the conductive members 3 and the test tool. Compared to using test tools equipped with elastic detection probes, the cost of the second embodiment including the conductive members 3 with the springs 33 is relatively lower, thereby effectively reducing the cost required for performing the electrical test and thereby increasing versatility.

Figure 4:
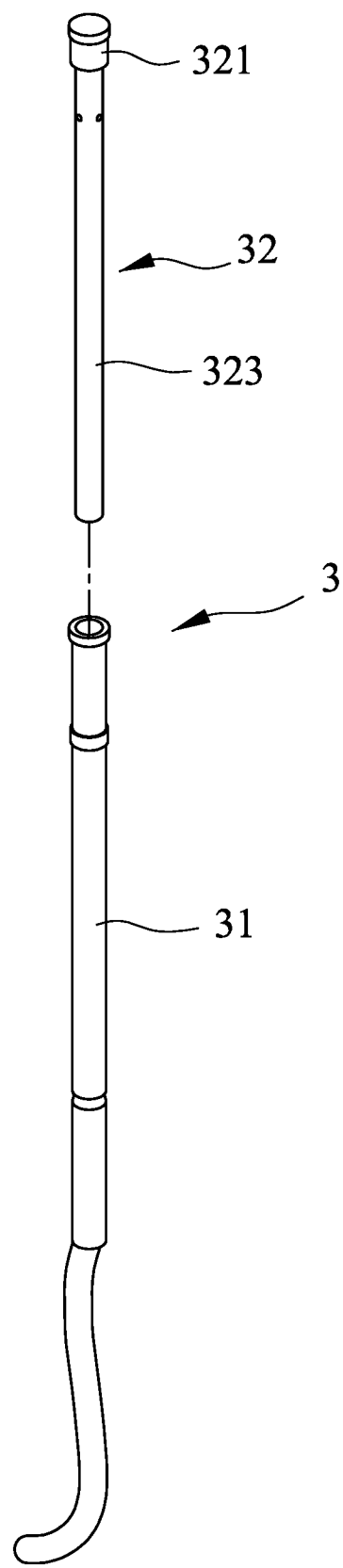
FIG. 4 is an exploded perspective view, illustrating a conductive member of a third embodiment of the electronic component carrier board according to the present disclosure.

Referring to FIGS. 1 and 4, a third embodiment of the electronic component carrier board of the present disclosure is shown to be similar to the first embodiment, and differs in that: the tubular body 31 of each conductive member 3 is fixedly embedded in a corresponding one of the slots 111, and the pin body 32 has an end seat portion 321 covering a top end of the tubular body 31 and located outside the conductive space 311, and an insertion portion 323 extending from the end seat portion 321 along an axial direction of the tubular body 31 and into the conductive space 311. In the third embodiment, the insertion portion 323 is removably inserted into the tubular body 31, so that another quick detach design is provided. The fixed tubular bodies 31 may be connected to the conductive wires 4 the welding or fastening methods. Although the tubular bodies 31 are fixed relative to the carrier plates 1, the electrical conduction path can be quickly adjusted by adjusting arrangement of the pin bodies 32.

In summary, the conductive members 3 may be quickly installed into the corresponding slots 111 through a simple direct insertion method, and thereby achieve a desired electrical connection with the conductive wires 4, not only can this significantly reduce the difficulty of assembling the circuit components, but it can also simplify the required process. Furthermore, the design of the entire or partial removal the conductive members 3 is also beneficial to quickly cope with adjustments after performing the necessary electrical testing debugging, and can provide various aspects for flexible selection to significantly enhance universality so the object of the present disclosure is truly achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic component carrier board, comprising:
   a plurality of carrier plates spaced apart from each other along a direction, each of said carrier plates having a plurality of through holes that extend from a top surface to a bottom surface of said carrier plate, said through holes of each of said carrier plates being respectively aligned with said through holes of an adjacent one of said carrier plates so that said carrier plates cooperatively form a plurality of slots;
   a plurality of insulating layers disposed between said carrier plates;
   a plurality of conductive members made of conductive material and each disposed in one of said slots, each of said conductive members including a tubular body that is inserted in a corresponding one of said slots and that defines a conductive space, and a pin body that is inserted in said conductive space and that is electrically connected with said tubular body, for each of said conductive members, at least one of said tubular body and said pin body being detachably disposed in the corresponding one of said slots;
   a plurality of conductive wires, each of said conductive wires being electrically connected to an outer periphery of one of said tubular bodies of said conductive members, being disposed between two adjacent ones of said carrier plates and being embedded within one of said insulating layers; and
   a plurality of conductive lines respectively connected to bottom ends of said tubular bodies, and electrically connected to said tubular bodies;
   wherein said tubular body of each of said conductive members is detachably inserted into the corresponding one of said slots, and said pin body of each of said conductive members is fixed to a top end of said tubular body of said conductive member; and
   wherein said pin body of each of said conductive members has an end seat portion covering a top end of said tubular body of said conductive member and located outside said conductive space, and a fixing portion extending from said end seat portion along an axial direction of said tubular body and into said conductive space, for each of said conductive members, said fixing portion being fixed to an inner wall surface of said tubular body.

* * * * *